(12) United States Patent
Minakata et al.

(10) Patent No.: US 6,519,179 B2
(45) Date of Patent: Feb. 11, 2003

(54) MAGNETIC TUNNEL JUNCTION DEVICE, MAGNETIC MEMORY ADOPTING THE SAME, MAGNETIC MEMORY CELL AND ACCESS METHOD OF THE SAME

(75) Inventors: Ryoji Minakata, Nara (JP); Masashi Michijima, Soraku-gun (JP); Hidekazu Hayashi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/733,646

(22) Filed: Dec. 8, 2000

(65) Prior Publication Data

US 2001/0005011 A1 Jun. 28, 2001

(30) Foreign Application Priority Data

Dec. 10, 1999 (JP) ............................................ 11-351048
Feb. 23, 2000 (JP) ....................................... 2000-045447
Mar. 10, 2000 (JP) ....................................... 2000-065913

(51) Int. Cl.$^7$ ................................................. G11C 11/14
(52) U.S. Cl. ........................ 365/171; 365/158; 365/173
(58) Field of Search ............................... 365/158, 171, 365/173

(56) References Cited

U.S. PATENT DOCUMENTS 4,455,626 A 6/1984 Lutes .......................... 365/158
5,587,943 A 12/1996 Torok et al. ................. 365/158
5,841,692 A 11/1998 Gallagher et al. ........... 365/173
6,256,222 B1 * 7/2001 Sakakima et al. ........... 365/158

FOREIGN PATENT DOCUMENTS

| DE | 198 36 567 A 1 | 2/2000 |
| EP | 0 875 901 A 2 | 11/1998 |
| JP | 09/106514 | 4/1997 |
| JP | 10-302456 | 11/1998 |
| JP | 10-302457 | 11/1998 |
| JP | 11-163436 | 6/1999 |

OTHER PUBLICATIONS

Spin Valve Read Head With Fe/A1203/Fe/NiFe Tunneling Junction, IBM Technical Bulletin, vol. 40, No. 04 (Apr. 1997) pp. 97–98.
Characteristics of AP Bias in spin Valve Memory Elements, Jian–Gang Zhu et al., IEEE Transactions on Magnetics, vol. 34, No. 4, (Jul. 1998) pp. 1063–1065.
Copy of EPO Search Report.

* cited by examiner

*Primary Examiner*—Son Mai
(74) *Attorney, Agent, or Firm*—David G. Conlin; William J. Daley, Jr.; Edwards & Angell, LLP (57) ABSTRACT

A closed magnetic circuit layer is formed on a ferromagnetic layer serving as a memory layer of a magnetic tunnel junction device, in such a manner that a closed magnetic circuit layer is formed via a metal layer with a spacing at a central portion. With this structure, stable magnetization state can be ensured even for a miniaturized pattern.

7 Claims, 8 Drawing Sheets

MAGNETIC TUNNEL JUNCTION DEVICE, MAGNETIC MEMORY ADOPTING THE SAME, MAGNETIC MEMORY CELL AND ACCESS METHOD OF THE SAME

FIELD OF THE INVENTION

The present invention relates to a magnetic tunnel junction device, a magnetic memory adopting the magnetic tunnel junction device, a magnetic memory cell and an access method of the magnetic memory cell.

BACKGROUND OF THE INVENTION

Magnetic tunnel junction (MTJ) devices are known to output a signal of a higher level as compared to conventional anisotropic magnetoresistive (AMR) effect devices and giant magnetoresistive (GMR) effect devices. For this beneficial features of the magnetic tunnel junction (MTJ) devices, their applications to reproducing head for hard disk drives (HDDs) or magnetic memories have been considered.

Especially, in the magnetic memories, the MTJ devices are solid memory of no active section like the semiconductor memories. However, the MTJ devices are advantageous over the semiconductor memories for their beneficial features: a) information stored therein will not be lost in an event of power shut off, b) rewriting of information is permitted unlimited number of times, c) even with an applied radioactive ray, the information stored therein would not be lost.

Figure 11:
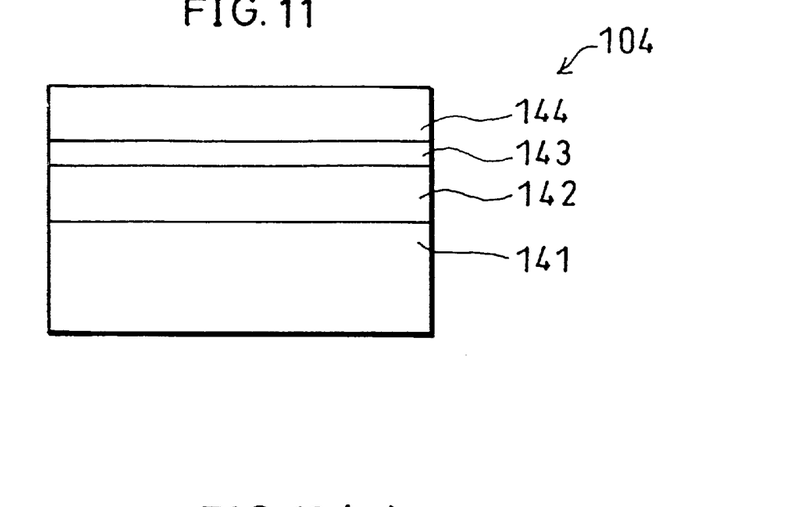
FIG. 11 is an explanatory view showing a structure of a conventional MTJ device.

An example structure of conventional MTJ device is shown in FIG. 11. Such structure is, for example, disclosed by Japanese Unexamined Patent Publication No. 106514/1997 (Tokukaihei 9-106514, published on Apr. 22, 1997).

As shown in FIG. 11, an MTJ device 104 includes an antiferromagnetic layer 141, a ferromagnetic layer 142, an insulating layer 143, and a ferromagnetic layer 144 which are laminated in this order. Both the ferromagnetic layer 142 and the ferromagnetic layer 144 have in-plane magnetizations which show such effective uniaxial magnetic anisotropy that the respective magnetizations are parallel to or antiparallel to one another. The magnetization of the ferromagnetic layer 142 is fixed in substantially one direction by an exchange coupling with the antiferromagnetic layer 141, and thus information is recorded thereon in a magnetization direction of the ferromagnetic layer 144.

For the antiferromagnetic layer 141, FeMn, NiMn, PtMn or IrMn alloy may be adopted. For the ferromagnetic layer 142 and the ferromagnetic layer 144, Fe, Co, Ni, or alloys thereof may be adopted. For the insulating layer 143, various kinds of oxides, nitrides, etc., may be used. However, it is known that the highest magnetoresistance (MR) can be obtained when adopting an $Al_2O_3$ film for the insulating layer 143.

Another MTJ device has been proposed of a structure without the antiferromagnetic layer 141, which utilizes a difference in coercive force between the ferromagnetic layer 142 and the ferromagnetic layer 144.

Figure 12A:
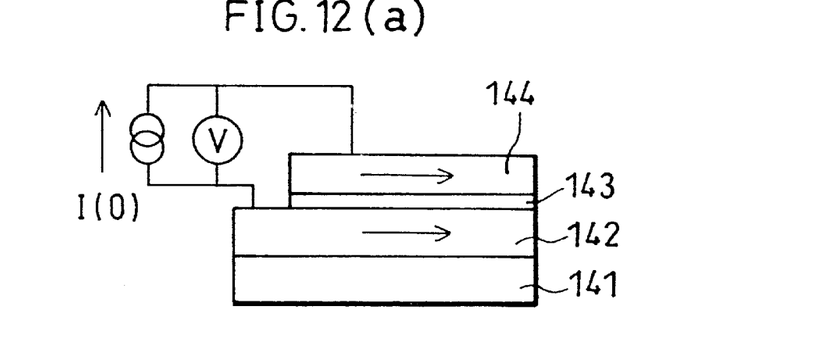
FIG. 12(a) and FIG. 12(b) are explanatory views showing a conventional MTJ device operation mechanism adopted in a magnetic memory.
Figure 12B:
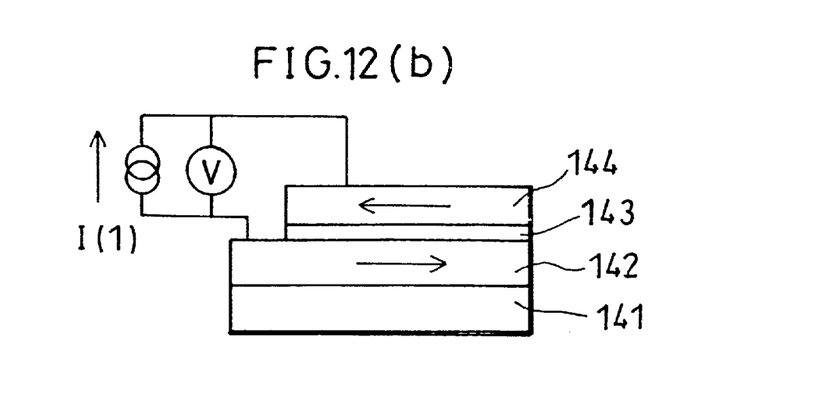

An operation mechanism of a magnetic memory application of the described MTJ device 104 of FIG. 11 is shown in FIGS. 12(a) and 12(b).

As described, both the ferromagnetic layer 142 and the ferromagnetic layer 144 have in-plane magnetization and show such effective uniaxial magnetic anisotropy that the respective magnetization are parallel to or antiparallel to one another.

The magnetization of the ferromagnetic layer 142 is fixed in substantially one direction by an exchange coupling with the antiferromagnetic layer 141, and a recording is performed based on the magnetization direction of the ferromagnetic layer 144.

Reading out operation is performed by detecting a resistance of the MTJ device 104 which differs depending on whether the magnetization of the memory layer of the ferromagnetic layer 144 and the magnetization of the ferromagnetic layer 142 are parallel to or antiparallel to each other.

Figure 13:
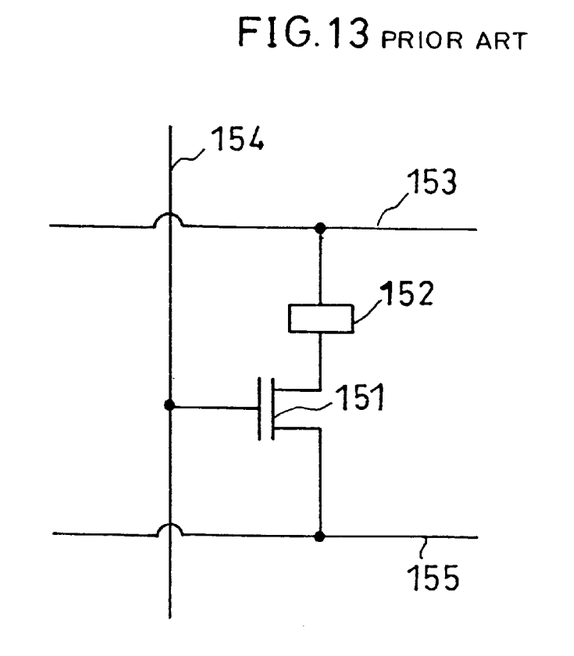
FIG. 13 is an explanatory view showing a schematic structure of a conventional magnetic memory.

FIG. 13 shows a schematic structure of a randomly accessible magnetic memory adopting the MTJ device of FIG. 11. The magnetic memory includes a transistor 151 for selecting an MTJ device 152 when reading out. The respective information represented by "0" and "1" are recorded based on the magnetization direction of the ferromagnetic layer 144 of the MTJ device 104 shown in FIG. 11. Then, information are read out utilizing the feature that the resistance value is low when the magnetization of the ferromagnetic layer 142 and the magnetization of the ferromagnetic layer 144 are parallel to one another, while the resistance value is high when the respective magnetization are antiparallel to one another.

On the other hand, recording is performed by inverting the magnetization direction of the ferromagnetic layer 144 by a synthetic magnetic field formed by a bit line 153 and a word line 154. A reference numeral 155 in FIG. 13 indicates a plate line.

In the described MTJ device 104, however, magnetic poles generate at both end portions due to the in-plane magnetization of the ferromagnetic layer 142 and the ferromagnetic layer 144. In order to meet a demand for high density magnetic memory, a miniaturization of the MTJ device 104 is necessary. However, the miniaturization of the MTJ device 104 results in a greater effect of the demagnetizing field caused by the magnetic poles generated at both end portions.

The ferromagnetic layer 142 which is exchange coupled with the antiferromagnetic layer 141 is not affected much by the described demagnetizing field. Further, as disclosed in U.S. Pat. No. 5,841,692, the magnetic poles generated at both end portions can be substantially eliminated.

However, the same cannot be applied to a memory layer of the ferromagnetic layer 144, and as the pattern is miniaturized, the magnetization becomes more unstable due to the magnetic poles generated at both end portions, thereby making it difficult to maintain the initial recorded state.

In order to counteract the foregoing problem, attempts have been made to suppress the effects of the magnetic poles at both end portions by arranging the memory layer of the ferromagnetic layer 144 so as to have a closed magnetic circuit structure. In this state, by arranging such that both the bit line and the word line are formed in the closed magnetic circuit, the magnetization direction of the ferromagnetic layer 144 can be inverted effectively when recording. However, since the bit line and the word line are formed in the same direction within the MTJ device, it is difficult to adopt the simple orthogonal array as shown in FIG. 13. The foregoing closed magnetic circuit structure is disclosed in, for example, Japanese Unexamined Patent Publication No. 302456/1998 (Tokukaihei 10-302456, published on Nov. 13, 1998), however, an optimal access method of the magnetic memory cell is not disclosed.

When applying the MTJ device to the magnetic head or the magnetic memory, it is important to attain a high resistance change ratio. However, an improvement in resistance change ratio by an optimal selection of a material is limited, and thus a method of improving resistance change ratio by modifying the film structure has been considered. For example, Japanese Unexamined Patent Publication No. 163436/1999 (Tokukaihei 11-163436, published on Jun. 18, 1999) realizes a high resistance change ratio by laminating a plurality of MTJ devices.

Figure 14:
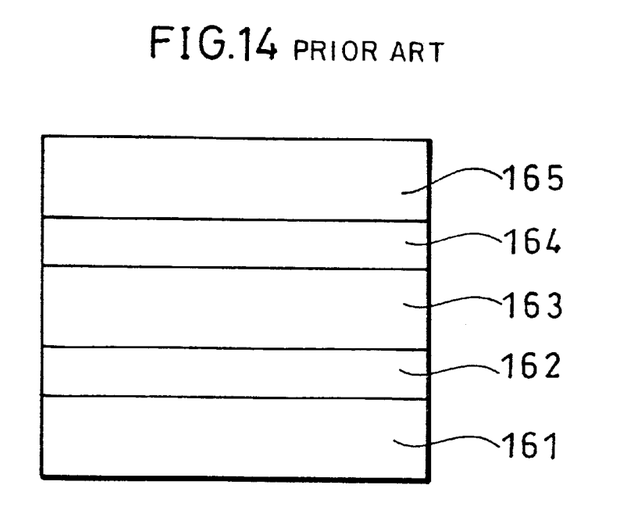
FIG. 14 is an explanatory view showing a schematic structure of a conventional MTJ device.

The structure of the MTJ device of Japanese Unexamined Patent Publication No. 163436/1999 is shown in FIG. 14. As shown in FIG. 14, the MTJ device includes a first ferromagnetic layer 161, a first insulating layer 162, a second magnetic layer 163, a second insulating layer 164 and a third magnetic layer 165 which are laminated in this order. The described MTJ device is mainly designed for the magnetic head; however, it can be also applied to magnetic memory.

In the case of applying the MTJ device of the structure shown in FIG. 14, the arrangement wherein the ferromagnetic layer 161, the ferromagnetic layer 163 and the ferromagnetic layer 165 all show in-plane magnetization which show such effective uniaxial magnetic anisotropy that the respective magnetization are parallel to or antiparallel to one another.

The respective magnetization of the ferromagnetic layer 161 and the ferromagnetic layer 165 are fixed in substantially one direction by the exchange coupling with the antiferromagnetic layer, and information is recorded based on the magnetization of the ferromagnetic layer 163. On the other hand, reading out of information is performed by detecting the resistance of the MTJ device which differs depending on whether the magnetization of the memory layer of the ferromagnetic layer 163 is parallel or antiparallel to other ferromagnetic layers 161 and 165. According to the structure shown in FIG. 14, the magnetic tunnel junction sections are connected in series, and thus, can output a signal of a level twice as high as the conventional MTJ device with a single magnetic tunnel junction section.

Writing is performed by changing a magnetization direction of the ferromagnetic layer 163 by utilizing a magnetic field generated by a current line disposed in a vicinity of the MTJ device.

In the described MTJ device also, the ferromagnetic layer 161, the ferromagnetic layer 163 and the ferromagnetic layer 165 have in-plane magnetization, and thus magnetic poles generate at both end portions. In order to realize high density magnetic memory, it is required to miniaturize the MTJ device. However, the miniaturization of the MTJ device results in a greater effect of the demagnetizing field caused by the magnetic poles generated at both end portions.

In the case where the ferromagnetic layers 161 and 165 are exchange coupled with the antiferromagnetic layer, the demagnetizing field is not affected much. By constituting the ferromagnetic layers 161 and 165 with two ferromagnetic layers which are exchange coupled, magnetic poles generated at both end portions are substantially zero.

However, the same cannot be applied to a memory layer of the ferromagnetic layer 163, and as the pattern is miniaturized, the magnetization becomes more unstable due to the magnetic poles generated at both end portions, thereby making it difficult to maintain the initial recorded state.

SUMMARY OF THE INVENTION

It is an object of the present invention to provide a magnetic tunnel junction device which can maintain a magnetization recorded in a memory layer under stable condition even for a miniaturized pattern, and a magnetic memory adopting the same.

It is another object of the present invention to provide an access method of a magnetic memory which permits a closed magnetic circuit structure to be introduced in a ferromagnetic layer of a memory layer without reducing a cell density of a magnetic memory.

In order to achieve the above object, the magnetic tunnel junction device of the present invention including at least a first magnetic layer, an insulating layer and a second magnetic layer which are laminated in this order, is characterized by further including:

a third magnetic layer formed on an opposite side of an insulating layer forming side of the first or second magnetic layer via a metal layer with a spacing at a central portion, wherein the first or second magnetic layer and the third magnetic layer form a closed magnetic circuit.

According to the forgoing arrangement, the magnetization of the third magnetic layer serving as the closed-magnetic circuit layer and the first or second magnetic layer form a closed loop; and thus the generation of the magnetic poles at both end portions can be avoided. As described, according to the MTJ device of the described structure, effects of the magnetic poles generated at both end portions can be avoided. Thus, a stable magnetization state as recorded can be maintained even for a miniaturized pattern. Additionally, since the memory layer of the ferromagnetic layer has a closed magnetic circuit structure, stable magnetization state as recorded can be ensured against an external leakage magnetic field.

In order to achieve the above object, a magnetic memory of the present invention is characterized by adopting a magnetic tunnel junction device including at least a first magnetic layer, an insulating layer and a second magnetic layer which are laminated in this order, and a third magnetic layer formed on an opposite side of an insulating layer forming side of the first or second magnetic layer via a metal layer with a spacing at a central portion, wherein the first or second magnetic layer and the third magnetic layer form a closed magnetic circuit.

According to the forgoing arrangement, the magnetization of the third magnetic layer serving as the closed magnetic circuit layer and the first or second magnetic layer form a closed loop; and thus the generation of the magnetic poles at both end portions can be avoided. As described, according to the MTJ device of the described structure, effects of the magnetic poles generated at both end portions can the eliminated. Thus, a stable magnetization state as recorded can be maintained for a miniaturized pattern. Additionally, since the memory layer of the ferromagnetic layer has a closed magnetic circuit structure, a stable magnetization state as recorded can be ensured against an external leakage magnetic field. Therefore, a power consumption of the magnetic memory adopting the MTJ device can be reduced.

In order to achieve the above object, another magnetic tunnel junction device of the present invention including a first magnetic layer, a first insulating layer, a second magnetic layer, a second insulating layer and a third magnetic layer which are laminated, is characterized by further including:

a fourth magnetic layer formed on either a first insulating layer forming side or a second insulating layer forming side of the second magnetic layer via a metal layer with a spacing at a central portion, wherein:

the second magnetic layer and the fourth magnetic layer form a closed magnetic circuit.

According to the described arrangement, a high resistance change ratio can be obtained, and the effects of the magnetic poles generated at both end portions can be reduced. Thus, a stable magnetization state as recorded can be maintained even for a miniaturized pattern. Additionally, since the memory layer of the ferromagnetic layer has a closed magnetic circuit structure, stable magnetization state as recorded can be ensured against an external leakage magnetic field.

In order to achieve the above object, another magnetic memory of the present invention is characterized by including: a first magnetic layer, a first insulating layer, a second magnetic layer, a second insulating layer and a third magnetic layer which are laminated, and further include a fourth magnetic layer formed either a first insulating layer forming side or a second insulating layer forming side of the second magnetic layer via a metal layer with a spacing formed at a central portion, wherein the second magnetic layer and the fourth magnetic layer form a closed magnetic circuit.

According to the described arrangement, a high resistance change ratio can be obtained, and the effects of the magnetic poles generated at both end portions can be reduced. Thus, a stable magnetization state as recorded can be maintained for a miniaturized pattern. As a result, a magnetic memory of an improved integration can be realized, and a power consumption of the magnetic memory can be reduced.

In order to achieve the above object, an access method of a magnetic memory cell of the present invention is characterized by including the steps of:

forming a closed magnetic circuit on a magnetic layer for storing a memory of a magnetic memory cell;

placing a first current line (bit line) in a closed magnetic circuit composed of the magnetic layer and the closed magnetic circuit layer, and a second current line (word line) outside the closed magnetic circuit;

changing the magnetization direction of the magnetic layer by applying such current to the first current line that the magnetization of the closed magnetic circuit layer is inverted but the magnetization of the magnetic layer is not inverted, and applying such current to the second current line that the magnetization of the magnetic layer is not inverted by the second current line alone, but the magnetization of the magnetic layer is inverted by a synthetic magnetic field with the first current line.

According to the described access method of the magnetic memory cell, by controlling the magnetic characteristics of the ferromagnetic layer and the closed magnetic circuit layer and the level of current flowing through the first current line (bit line) and the second current line (word line), access to only one magnetic memory cell is permitted, and a required recording current can be reduced. Further, the effects of magnetic poles at both end portions on the magnetic memory cell can be suppressed. As a result, a stable magnetization state can be ensured even for a miniaturized pattern, and a highly integrated magnetic memory can be realized. Additionally, by adopting the closed magnetic circuit layer structure for the memory layer, a stable magnetization state as recorded can be ensured against an external leakage magnetic field. Further, a power consumption of the magnetic memory can be reduced.

Further, the first current line is formed within the closed magnetic circuit layer structure formed by the magnetic layer and the closed magnetic circuit layer, the magnetization of the closed magnetic circuit layer can be inverted at sufficiently low current, thereby effectively applying the magnetic layer.

For a fuller understanding of the nature and advantages of the invention, reference should be made to the ensuing detailed description taken in conjunction with the accompanying drawings.

DESCRIPTION OF THE EMBODIMENTS

First Embodiment

The following descriptions will discuss one embodiment of the present invention in reference to figures.

Figure 1:
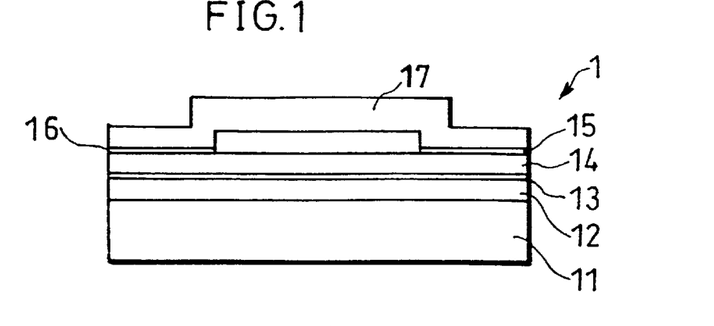
FIG. 1 is an explanatory view showing a schematic structure of an MTJ device in accordance with one embodiment of the present invention.

As shown in FIG. 1, the MTJ device 1 of the present embodiment includes: an antiferromagnetic layer 11, a ferromagnetic layer 12, an insulating layer 13, a ferromagnetic layer 14, metal layers 15 and 16, closed magnetic circuit layer 17 (third magnetic layer). The antiferromagnetic layer 11 and the ferromagnetic layer 12 are exchange coupled. The ferromagnetic layer 14 and the closed magnetic circuit layer 17 are connected at both sides via the metal layers 15 and 16, while separated in the central part. Either of the magnetic layer 12 or the magnetic layer 14 corresponds to the first magnetic layer, and the other corresponds to the second magnetic layer. The closed magnetic circuit layer 17 corresponds to the third magnetic layer.

For the material of the antiferromagnetic layer 11, FeMn, NiMn, PtMn or IrMn alloy may be adopted. For the material of the ferromagnetic layers 12 and 14 and the closed magnetic circuit layer 17, Fe, Co or Ni alloy may be adopted. For the material of the insulating layer 13, the $Al_2O_3$ film is the most preferable in view of magnetoresistance (MR). However, the material of the insulating layer 13 is not limited to be above, and, for example, oxides, nitrides, may be adopted. Or the insulating layer 13 made of Si, diamond, or diamond like carbon (DLD) film may be adopted.

For the metal layers 15 and 16, Ru, Cr, or Cu or alloys thereof may be adopted. The thickness of the metal layers 15 and 16 is set such that antiferromagnetic coupling is exerted between the ferromagnetic layer 14 and the closed magnetic circuit layer 17. In this state, since respective magnetization of the ferromagnetic layer 14 and the closed magnetic layer 17 form a closed loop (closed magnetic circuit), generation of magnetization at the end portions can be avoided.

It is preferable that the thickness of the ferromagnetic layers 12, 14 and the closed magnetic circuit layer 17 be in a range of from 10 Å to 1000 Å. If these films are too thin, superparamagnetism occurs, and thus, the magnetic layer desirably has thickness of not less than 10 Å. On the other hand, if the film is too thick, in the closed circuit structure of the present invention, the effects of the magnetic poles at both end portions cannot be avoided, and thus it is desirable that the magnetic layer has a thickness in a range of not more than 1000 Å. Each magnetic layer may be constituted by a plurality of films, and in this case, it is desirable that the total thickness is set in a range of not less than 10 Å to no not more than 1000 Å.

It is preferable that the thickness of the insulating film 13 be in a range of from 3 Å to 30 Å. If the insulating layer 13 has a thickness of not more than 3 Å, the ferromagnetic layer 12 and the ferromagnetic layer 14 may be electrically shorted. On the other hand, if the insulating layer 13 has a thickness of not less than 30 Å, tunnel of electron is less likely to occur, and the magnetoresistance ratio would be lowered.

In the structure shown in FIG. 1, the metal layers 15 and 16 are separately provided. However, it is obvious that a continuous metal layer of a single structure in replace of the metal layers 15 and 16 also enables the object of the present invention to be achieved.

Figure 2:
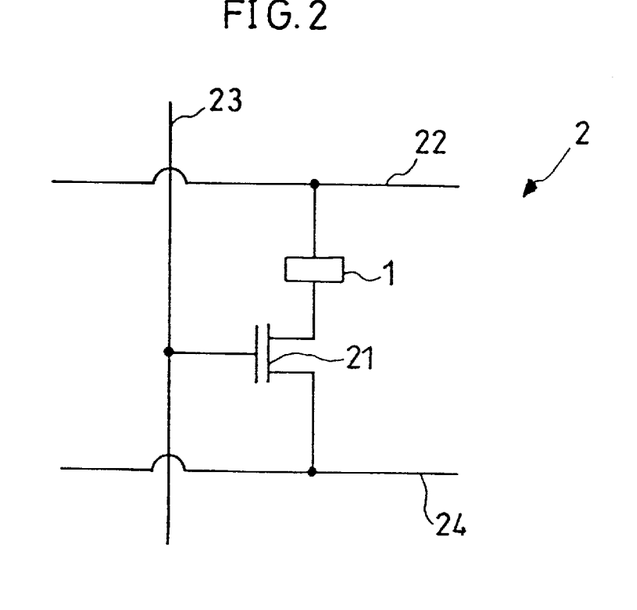
FIG. 2 is an explanatory view showing a schematic structure of a magnetic memory adopting the MTJ device of FIG. 1.

FIG. 2 is a schematic view of the MTJ device 1 adopted in a randomly accessible magnetic memory 2.

The transistor 21 is provided for selecting the MTJ device 1 when reading out. Information indicated by "0" and "1" are recorded based on the magnetization direction of the ferromagnetic layer 14 of the MTJ device 1 shown in FIG. 1, and the magnetization direction of the ferromagnetic layer 12 is fixed. The information are read out utilizing such magnetic resistance effects that the resistance of the MTJ device 1 is low when respective magnetizations of the ferromagnetic layer 12 and the ferromagnetic layer 14 are in parallel, while the resistance of the MTJ device 1 is high when the respective magnetizations are in antiparallel. On the other hand, information are written by inverting respective magnetization directions of the ferromagnetic layer 14 and the closed magnetic circuit layer 17 by a synthetic magnetic field formed by the bit line 22 (lead line) and the word line 23 (lead line).

Figure 3:
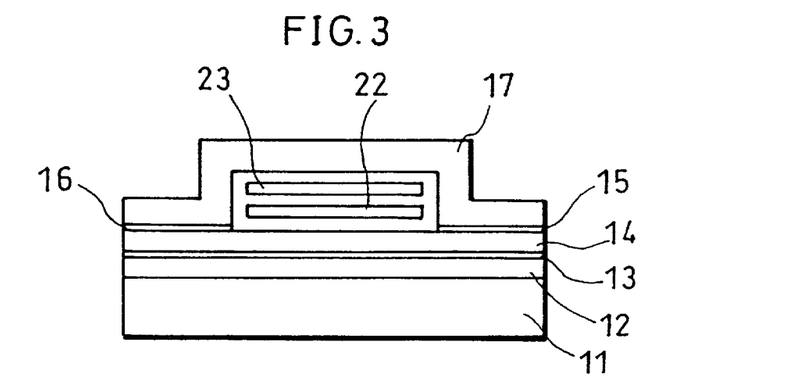
FIG. 3 is an explanatory view showing an arrangement of a word line and a bid line of the magnetic memory shown in FIG. 2.

Example arrangements of the bit line 22 and the word line 23 are shown in FIG. 3. In the figure, the reference numeral 24 shows a plate line. Here, by passing the bit line 22 and the word line 23 in a spacing formed at a central part between the ferromagnetic layer 14 and the closed magnetic circuit layer 17, a current value required for inverting the directions of the respective magnetizations of the ferromagnetic layer 14 and the closed magnetic circuit layer 17 can be reduced, thereby permitting power consumption of the magnetic memory to be reduced.

The respective arrangements of the bit line and the word line are not limited to the arrangement shown in FIG. 3. For example, the bit line and the word line may be formed on the same plane. Or, either one of the bit line or the word line may be formed on the same plane. Or, both of or either one of the lines may be formed to the exterior but close to the MTJ device. In this way, the process can be simplified.

In FIG. 3, both the bit line 22 and the word line 23 are electrically insulated from the ferromagnetic layer 14 and the closed magnetic circuit layer 17. However, the present invention is not limited to this arrangement, and it may be arranged such that either one of the bit line 22 or the word line 23 is electrically connected to the ferromagnetic layer 17, to detect variations in resistance.

In the foregoing descriptions, the magnetization of the ferromagnetic layer 12 is fixed by the exchange coupling with the antiferromagnetic layer 11. Alternatively, a ferromagnetic material of a large coercive force may be adopted in order to fix the magnetization of the ferromagnetic layer 12.

By adopting two ferromagnetic layers which are antiferromagnetically coupled via the metal layer, effects of the magnetic pole generated at the end portions of the ferromagnetic layer 12 can be reduced. Alternately, when adopting the ferromagnetic material like rare-earth-transition metal alloy of a composition near the compensation point, the effects of the magnetic pole at the end portion can be reduced.

The respective layers of the present embodiment may be laminated in the reversed order. Also, although explanations have been given through the case of adopting the closed magnetic circuit structure formed in one of the ferromagnetic layers, the present invention is not limited to this, and the structure wherein both of the ferromagnetic layers have the closed magnetic circuit structure may be adopted.

In the present embodiment, only the MTJ device portion is shown; however, it is needless to mention that in an actual device forming process, the electrode for supplying current, the substrate, the protective layer and an adhesive layer are provided.

Second Embodiment

The following descriptions will discuss another embodiment of the present invention in reference to figures.

Figure 4:
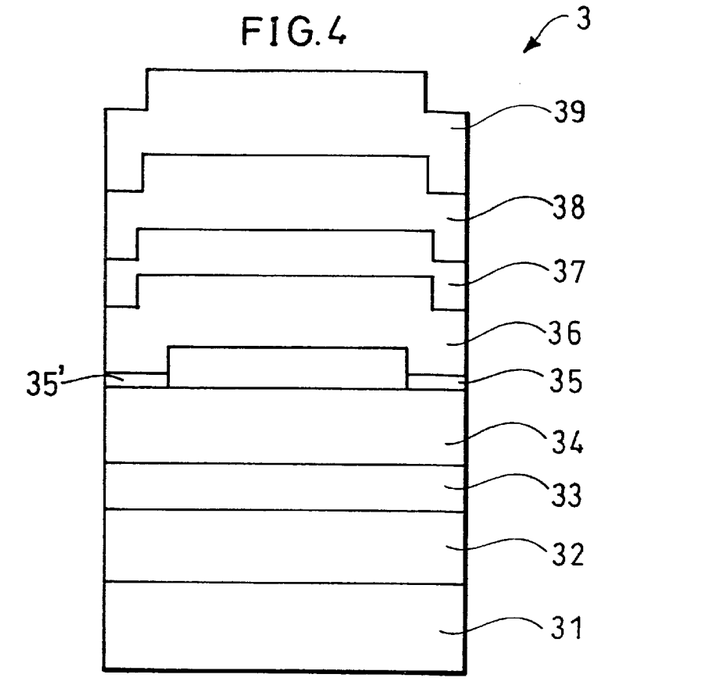
FIG. 4 is an explanatory view showing a schematic structure of the MTJ device in accordance with another embodiment of the present invention.

FIG. 4 shows a schematic structure of an MTJ device of the present embodiment.

As shown in FIG. 4, an MTJ device 3 of the present embodiment includes an antiferromagnetic layer 31 (first antiferromagnetic layer), a ferromagnetic layer 32, an insulating layer 33, a ferromagnetic layer 34 (second magnetic layer), metal layers 35, 35', a ferromagnetic layer (closed magnetic circuit layer, fourth magnetic layer) 36, an insulating layer 37, a ferromagnetic layer 38 and an antiferromagnetic layer 39 (second antiferromagnetic layer). The ferromagnetic layer 34 and the antiferromagnetic layer (closed magnetic circuit layer) 36 are connected via the metal layers 35, 35' and are separated at the central portion.

In the above arrangement, by setting the film thickness of the metal layers 35, 35' such that an antiferromagnetic complying is exerted between the ferromagnetic layer 34 and the ferromagnetic layer (closed magnetic circuit layer) 36, the respective magnetization directions of the ferromagnetic layer 34 and the ferromagnetic layer (closed magnetic circuit layer) 36 can be made opposite to each other. Therefore, the respective magnetization of the ferromagnetic layer 34 and the ferromagnetic layer (closed magnetic layer) 36 form a closed loop, and thus generation of a magnetic wall at the both end parts of the ferromagnetic layer 34 can be avoided.

The antiferromagnetic layer 31 and the ferromagnetic layer 32, and the antiferromagnetic layer 39 and the ferromagnetic layer 38 are exchange coupled respectively, and the magnetization directions of the ferromagnetic layer 32 and the ferromagnetic layer 38 are fixed.

For materials of the ferromagnetic layers 32, 34 and 38, and the closed magnetic circuit layer 36, Fe, Co, Ni or alloys thereof may be adopted. For the materials of the antiferromagnetic layers 31 and 39, alloys of FeMn, NiMn, PtMn, IrMn, etc., may be adopted.

For insulating layers 33 and 37, the $Al_2O_3$ film is the most preferable in view of magnetoresistance (MR). However, the material of the insulating layers 33 and 37 is not limited to be above, and, for example, oxides, nitrides, may be adopted. Or the insulating layers 33 and 37 made of Si, diamond, or diamond like carbon (DLD) film may be adopted. For the metal layers 35, 35', Ru, Cr, Cu, etc., or alloys thereof may be adopted.

In the described MTJ device 3, information are recorded based on the magnetization direction of the closed loop formed by the ferromagnetic layer 34 and the ferromagnetic layer (closed magnetic layer) 36. On the other hand, reproducing of information is performed based on changes in resistance depending on whether the magnetization direction of the ferromagnetic layers 32 and 38 (fixed layers) and the magnetization direction of the closed loop formed by the ferromagnetic layer 34 and the ferromagnetic layer (closed magnetic circuit layer) 36 are parallel or antiparallel.

As described, the recorded information are stored based on the magnetization direction of the closed loop formed by the ferromagnetic layer 34 and the ferromagnetic layer (closed magnetic circuit layer) 36. This means that the respective magnetization of the ferromagnetic layers 32 and 38 are needed to be fixed in opposite directions by the antiferromagnetic layer 31 and the antiferromagnetic layer 39.

Such magnetization can be realized by adopting materials of different temperatures (blocking temperature) Tb at which exchange coupled magnetic field loses for the antiferromagnetic layers 31 and 39.

For example, explanations will be given through the case of adopting the PtMn film for the antiferromagnetic layer 31, and the IrMn film for the antiferromagnetic layer 39. PtMn is an antiferromagnetic layer of an order phase of AuCuI type, and its Tb1 is 380° C. On the other hand, IrMn is an antiferromagnetic member having a face-centered cubic structure, and Tb2 is 270° C.

After molding all the layers (31 to 39) under vacuum condition, a heat treatment is applied for 6 hours at 250° C. while applying a magnetic field in a direction of ordering the antiferromagnetic layer 31 composed of the PtMn film. As a result, the PtMn file (antiferromagnetic layer 31) is ordered, and its spin is aligned in the process of cooling off while having an effect of magnetization of the ferromagnetic layer 32 in which its spin is aligned in the magnetic field application direction. By the resulting exchange coupling, the ferromagnetic layer 32 is fixed in the direction the magnetic field is applied.

Next, heat is applied to temperatures in a range of not less than Tb2 and not more than Tb1, and cooling is performed while applying a magnetic field in an opposite direction (180°) from the original state. As a result, the spin of the antiferromagnetic layer composed of IrMn film is realigned in the process of cooling off having an effect of the magnetization of the adjacent ferromagnetic layer 38 to which the magnetic filed in the opposite direction is applied, and is fixed in antiparallel direction to that of the initial heating process.

As the temperature is not more than Tb1, the direction of the magnetic field of the exchange coupling between the antiferromagnetic layer 31 composed of PtMn film and the ferromagnetic layer 32 is not affected, and the magnetization of the ferromagnetic layer 32 is maintained in the direction of the initial heating process, whereby respective magnetization directions of the ferromagnetic layer 32 and the ferromagnetic layer 38 become antiparallel to one another.

The material and the alignment direction of the antiferromagnetic layer are not limited to the above as long as the two antiferromagnetic layers have different Tbs. Besides i) the heating method in the magnetic field, the foregoing arrangement of magnetization can be realized by ii) controlling the direction of magnetization when forming films, or combination of i) and ii). Needless to mention, when adopting the disorder alloy film for the antiferromagnetic layer, a heat treatment for ordering as required when adopting the order alloy film can be omitted.

It is preferable that the ferromagnetic layers 32, 34 and 38, and the closed ferromagnetic circuit layer 37 is in a range of from not less than 10 Å to not more than 1000 Å. If these films are too thin, a superparamagnetism occurs, and thus, the magnetic layer desirably has thickness of not less than 10 Å. On the other hand, if the film is too thick, in the closed circuit structure of the present invention, the effects of the magnetic poles at both end portions cannot be avoided, and thus it is desirable that the magnetic layer has a thickness in a range of not more than 1000 Å. Each magnetic layer may be constituted by a plurality of films, and in this case, it is desirable that the total thickness is set in a range of not less than 10 Å to not more than 1000 Å.

It is also desirable that the insulating layers 33, 37 respectively have thickness in a range of from 3 Å to 30 Å. If the thickness of the insulating layer 33, 37 is not more than 3 Å, the ferromagnetic layer 32 and the ferromagnetic layer 34, or the ferromagnetic layer 36 and the ferromagnetic layer 38 may be electrically shorted. In the case where the thickness of the insulating film 33, 37 is not less than 30 Å, a tunneling of an electron is less likely to occur, and the magnetic resistance ratio becomes smaller.

In the structure shown in FIG. 4, the respective metal layers 35, 35' are separately provided; however, it is needless to mention that a single continuous metal layer may be adopted to realize the object of the present invention.

Furthermore, by arranging such that the ferromagnetic layer 32 and the ferromagnetic layer 38 are composed of two magnetic layers respectively, the magnetic poles generated at both end parts can be eliminated. Even in the case of adopting three or more magnetic layers for each of these magnetic layers, generation of magnetic pole at both end portions may be avoided by adjusting the film thickness of the ferromagnetic layer.

Next, an example of a randomly accessible magnetic memory 80 adopting the MTJ device 3 of the present embodiment will be explained in reference to FIG. 5.

Figure 5:
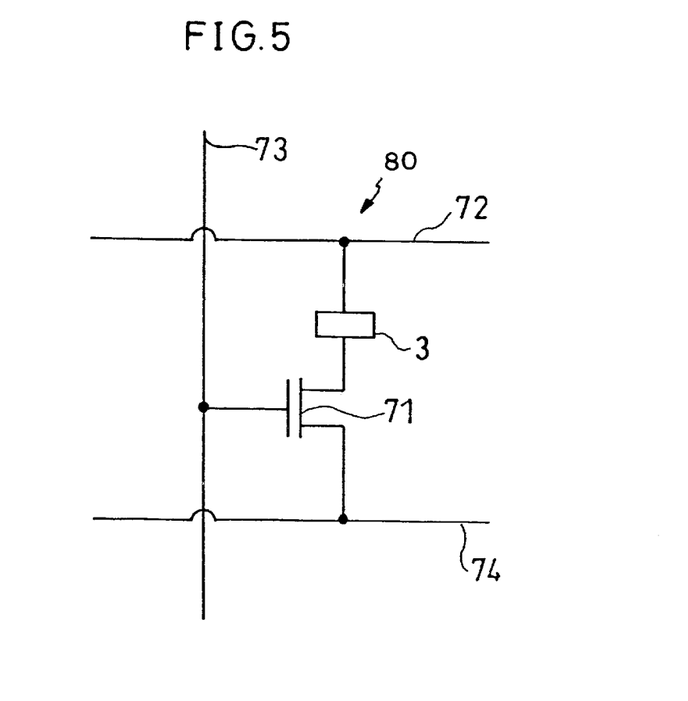
FIG. 5 is an explanatory view showing a schematic structure of the magnetic memory adopting the MTJ device shown in FIG. 4.

In FIG. 5, the transistor 71 has a function of selecting the MTJ device 3 when reading out. The information represented by "1" and "0" are recorded based on the magnetization directions of the ferromagnetic layer 34 and the ferromagnetic layer (closed magnetic circuit layer) 36 of the MTJ device 3 shown in FIG. 4. Information are read out utilizing such characteristics that the resistance value is low when respective magnetization of the ferromagnetic layer 32 and the ferromagnetic layer 34 are parallel, and respective magnetization of the ferromagnetic layer 38 and the ferromagnetic layer (closed magnetic circuit layer) 36 are parallel, while the resistance value is high when the respective magnetization are in antiparallel. On the other hand, information are recorded by inverting the magnetization direction of the ferromagnetic layer 34 and the ferromagnetic layer (closed magnetic circuit layer) 36.

In FIG. 5, the reference numeral 74 indicates a plate line.

Figure 6:
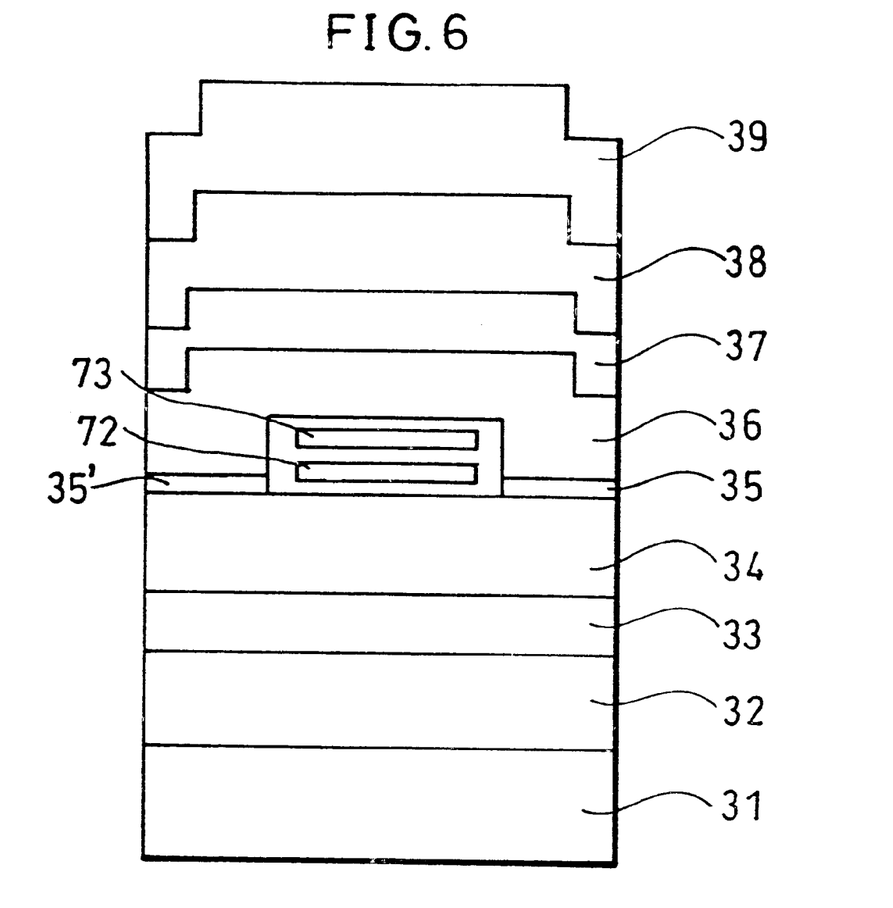
FIG. 6 is an explanatory view showing an arrangement of a word line and a bit line of the magnetic memory adopting the MTJ device of the present invention.

FIG. 6 shows an example arrangement of the bit line 72 and the word line 73.

In FIG. 6, by forming the bit line 72 and the word line 73 in a spacing at the central portion between the ferromagnetic layer 34 and the antiferromagnetic layer (closed magnetic circuit layer) 36, a current value required for inverting the magnetization directions of the ferromagnetic layer 34 and the ferromagnetic layer (closed magnetic circuit layer) 36 can be reduced, thereby suppressing power consumption of the magnetic memory.

Both the bit line 72 and the word line 73 are electrically insulated from the ferromagnetic layer 34 and the ferromagnetic layer (closed magnetic circuit layer) 36.

Third Embodiment

The following descriptions will discuss still another embodiment of the present invention in reference to figures.

Figure 7:
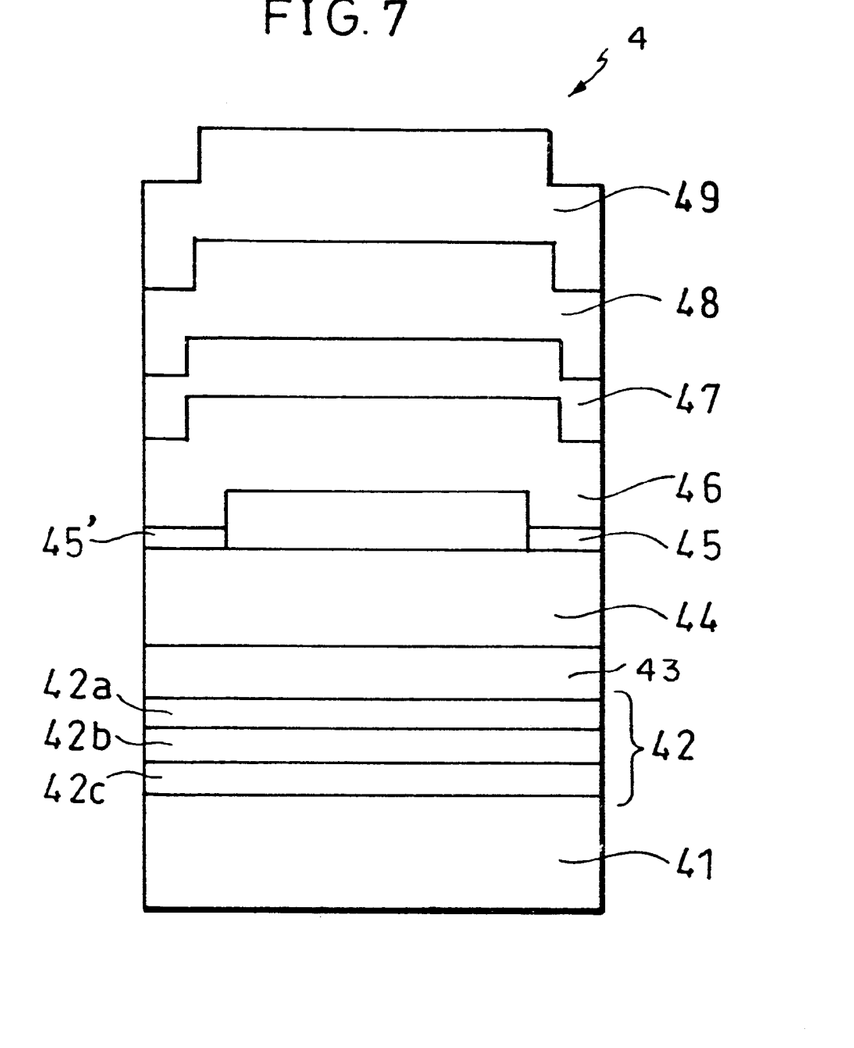
FIG. 7 is an explanatory view showing a schematic structure of an MTJ device in accordance with still another embodiment of the present invention.

FIG. 7 shows a schematic structure of an MTJ device of the present embodiment.

As shown in FIG. 7, the MTJ device 4 in accordance with the present embodiment includes an antiferromagnetic layer 41 (first antiferromagnetic layer), a ferromagnetic layer 42 (first magnetic layer), an insulating layer 43 (first insulating layer), a ferromagnetic layer 44 (second magnetic layer), metal layers 45, 45', a ferromagnetic layer (closed magnetic circuit layer, fourth magnetic layer) 46, an insulating layer 47 (second insulating layer), a ferromagnetic layer 48 (third magnetic layer) and an antiferromagnetic layer 49 (second antiferromagnetic layer). The ferromagnetic layer 44 and the antiferromagnetic layer (closed magnetic circuit layer) 46 are connected via the metal layers 45, 45' at both end parts with a spacing at a central portion.

In the above arrangement, by setting the film thickness of the metal layers 45, 45' such that an antiferromagnetic coupling is exerted between the ferromagnetic layer 44 and the ferromagnetic layer (closed magnetic circuit layer) 46, the respective magnetization directions of the ferromagnetic layer 44 and the ferromagnetic layer (closed magnetic circuit layer) 46 can be made opposite to each other. Therefore, the respective magnetization of the ferromagnetic layer 44 and the ferromagnetic layer (closed magnetic circuit layer) 46 form a closed loop, and thus generation of a magnetic wall at both end parts of the ferromagnetic layer 44 can be avoided.

The MTJ device 4 of the present embodiment differs from the MTJ device 3 of the second embodiment in that the ferromagnetic layer 42 is composed of two ferromagnetic layer 42a (second ferromagnetic layer) and the ferromagnetic layer 42c which are antiferromagnetically coupled via a metal layer 42b (second metal layer), and the ferromagnetic layer 42c (first ferromagnetic layer) which is exchange coupled with the antiferromagnetic layer 41. As in the second embodiment, the antiferromagnetic layer 49 and the ferromagnetic layer 48 are exchange coupled.

The magnetization of the ferromagnetic layer 48 is fixed by exchange coupling with the antiferromagnetic layer 49. The magnetization of the ferromagnetic layer 42c is fixed by exchange coupling with the antiferromagnetic layer 41. Further, the ferromagnetic layer 42a is antiferromagnetically coupled via the metal layer 42b, and thus has magnetization in opposite direction to the ferromagnetic layer 42c.

The MTJ device 4 records information based on the magnetization direction of a closed loop composed of the ferromagnetic layer 44 and the ferromagnetic layer (closed magnetic circuit layer) 46. The MTJ device 4 reads out information based on changes in resistance depending on whether the magnetization direction of the closed loop composed of the ferromagnetic layer 44 and the ferromagnetic layer (closed magnetic circuit layer) 46 and the magnetization direction of the ferromagnetic layers 42a and 48 are parallel to or antiparallel to one another.

As described, in order to read out information in the foregoing manner, i.e., based on changes in resistance depending on whether the magnetization direction of the closed loop composed of the ferromagnetic layer 44 and the ferromagnetic layer (closed magnetic circuit layer) 46 and the magnetization direction of the ferromagnetic layers 42a and 48 are parallel to or antiparallel to one another, it is required to fix the magnetization direction of the ferromagnetic layer 42c in the same direction as the antiferromagnetic layer 48.

According to the foregoing arrangement, the respective magnetizations of the ferromagnetic layer 42c and the ferromagnetic layer 48 can be fixed with a single treatment or a magnetic field of the same direction. As a result, the process of reading out can be simplified as compared to the previous embodiment.

In the present embodiment, the ferromagnetic layer 42 of a double layer structure, and an ferromagnetic layer 48 of a single layer structure are adopted. However, the present invention is not limited to this arrangement as long as the condition that the respective numbers of magnetic layers differ between the two fixed layers by one.

In the present embodiment, the same antiferromagnetic material may be used for the antiferromagnetic layer 41 and the antiferromagnetic layer 49.

The MTJ device 4 of the present embodiment can be used in the magnetic memory as in the MTJ device 3 of the second embodiment.

In the present embodiment, only the MTJ device portion is shown; however, it is needless to mention that in actual device forming process, the electrode for supplying current, the substrate, the protective layer and an adhesive layer are needed.

Fourth Embodiment

The following descriptions will discuss still another embodiment of the present invention in reference to figures.

Figure 8:
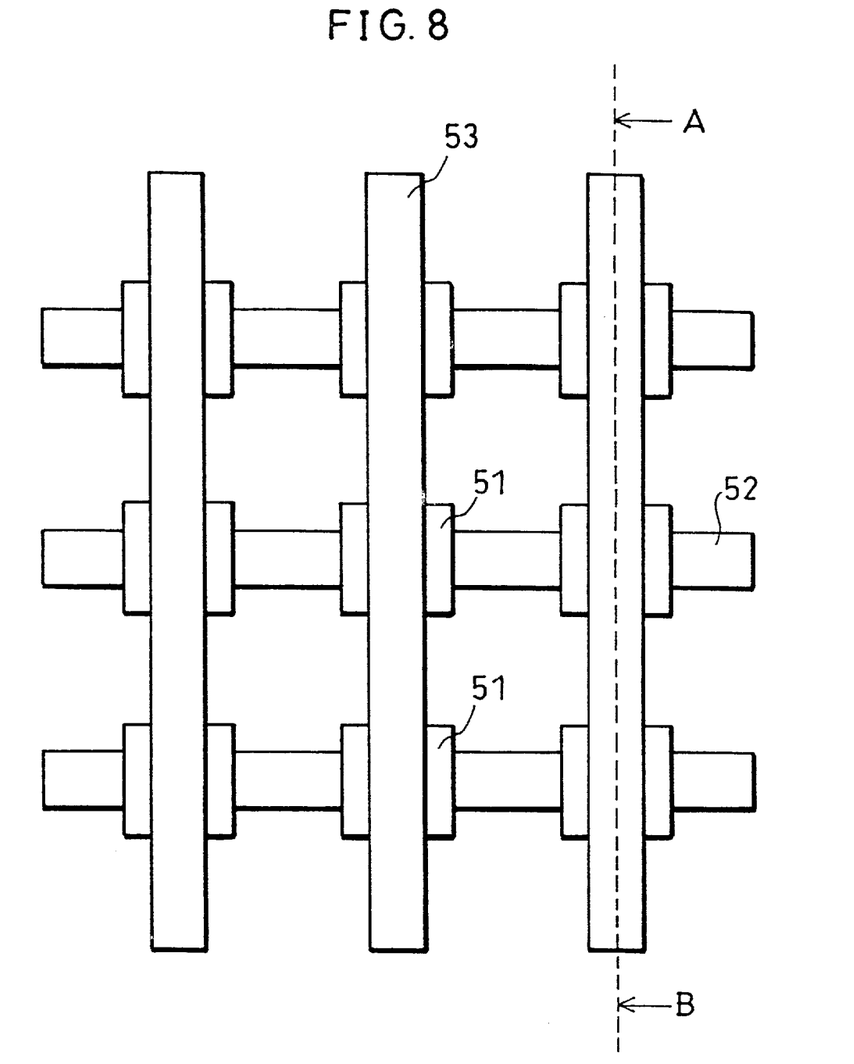
FIG. 8 is an explanatory view showing one example of a magnetic memory cell of the present invention.
Figure 9:
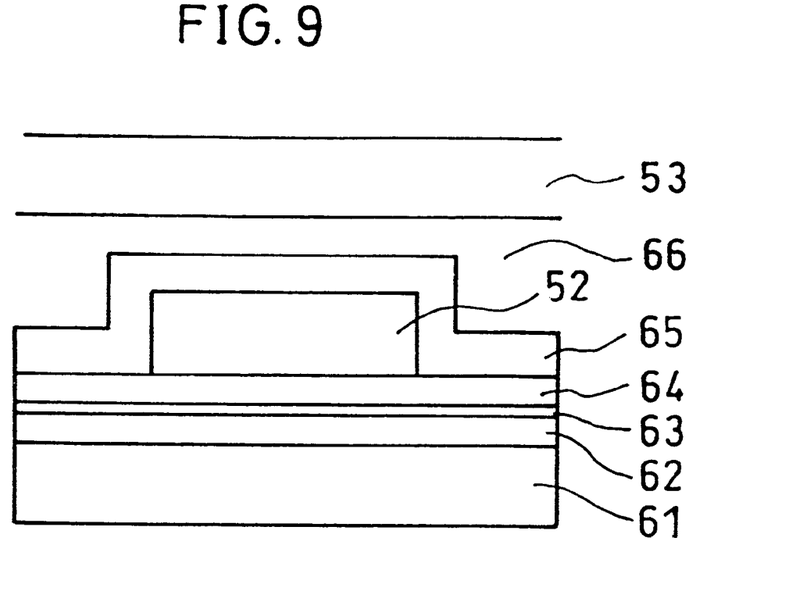
FIG. 9 is an explanatory view showing a schematic structure of another example of a magnetic memory cell of the present invention.

A magnetic memory adopting an MTJ device in accordance with the present embodiment is shown in FIG. 8. As shown in FIG. 8, respective magnetic memory cells 51 are disposed at intersections between a bit lines 52 (first current line) and the word lines 53 (second current lines). The magnetic memory cell 51 has the closed magnetic circuit structure in the vertical axis direction in the Figure, and has the magnetization also in the vertical axis direction. FIG. 9 shows a cross section cut by a line A–B of FIG. 8. For simplification, a single magnetic memory cell is shown.

As shown in FIG. 9, the magnetic memory cell 51 includes a closed magnetic circuit layer 65 formed on the MTJ device composed of an antiferromagnetic layer 61, an ferromagnetic layer 62, an insulating layer 63, and a ferromagnetic layer 64 (magnetic layer). The antiferromagnetic layer 61 and the ferromagnetic layer 62 are exchange coupled. The ferromagnetic layer 64 and the closed magnetic circuit layer 65 are connected at both end portions, and are separated at the central portion. The bit line 52 is provided in the above spacing in the central portion, and is electrically connected to the MTJ device. The word line 53 is provided on the magnetic memory cell 51 via the insulating layer 66.

Therefore, one end of the MTJ device is electrically connected to the bit line 52, and the other end is connected to a drain of the selective transistor (not shown). The word line is electrically insulated from the MTJ device and is connected to a gate of a selective transistor (not shown). As a result, randomly accessible layout shown in FIG. 5 can be realized.

The information of the magnetic memory cell are recorded in the magnetization direction of the ferromagnetic layer 64. On the other hand, the magnetization direction of the ferromagnetic layer 62 is fixed by an exchange coupling with the antiferromagnetic layer 61. Therefore, the information recorded in the magnetic memory cell, i.e., the magnetization direction of the ferromagnetic layer is detected based on changes in resistance whether the respective magnetization directions of the ferromagnetic layer 62 and the ferromagnetic layer 64 are in parallel or in antiparallel.

The rewriting of information on the magnetic memory cell can be realized by changing the magnetization direction of the ferromagnetic layer 64 by applying current to the bit line 52 and the word line 53. In this state, except for the magnetic memory cell 51 disposed at the intersection between the bit line 52 for flowing therethrough current and the word line 53, the magnetization of the ferromagnetic layer 62 of the magnetic memory cell is needed to be fixed. This condition can be realized, for example, as below-indicated.

The ferromagnetic layer 64 can store information, and has coercive force that enables rewriting at a recording current. On the other hand, the closed magnetic circuit layer 65 is made of a material having a smaller coercive force than that of the ferromagnetic layer 64. When rewriting information in the magnetic memory cell 51, such current that inverts magnetization of the closed magnetic circuit layer 65 but the magnetization of the ferromagnetic layer 64 is not inverted is applied to the bit line 52. To the word line 53, such current that the synthetic magnetic field with the bit line 52 inverts the magnetization of the ferromagnetic layer 64, but the magnetization of the ferromagnetic layer 64 is not inverted by the word line 53 alone. In this state, the magnetic field from the bit line 52 is not applied to other cells than the magnetic memory cell 51 on the bit line 52, and thus the magnetization direction of the ferromagnetic layer 42 is not changed.

As described, by controlling the magnetic characteristics of the ferromagnetic layer 64 and the closed magnetic circuit layer 65 and the level of current applied to the bit line 52 and the word line 53, only the magnetization direction of the magnetic memory cell 51 at the intersection between the bit line 52 and the word line 53 can be changed.

According to the described arrangement, the bit line 52 is provided in the closed magnetic circuit structure composed of the ferromagnetic layer 64 and the closed magnetic circuit layer 65, the magnetization of the closed magnetic circuit layer 65 is inverted at sufficiently low current, and a magnetic field can be effectively applied to the ferromagnetic layer 64. Therefore, compared to the conventional structure shown in FIG. 11, the magnetization direction of the magnetic memory cell 51 can be altered at sufficiently low current. Therefore, by constituting the closed magnetic circuit layer 65 of a material of high permeability, it is effective to reduce the recording current.

Figure 10:
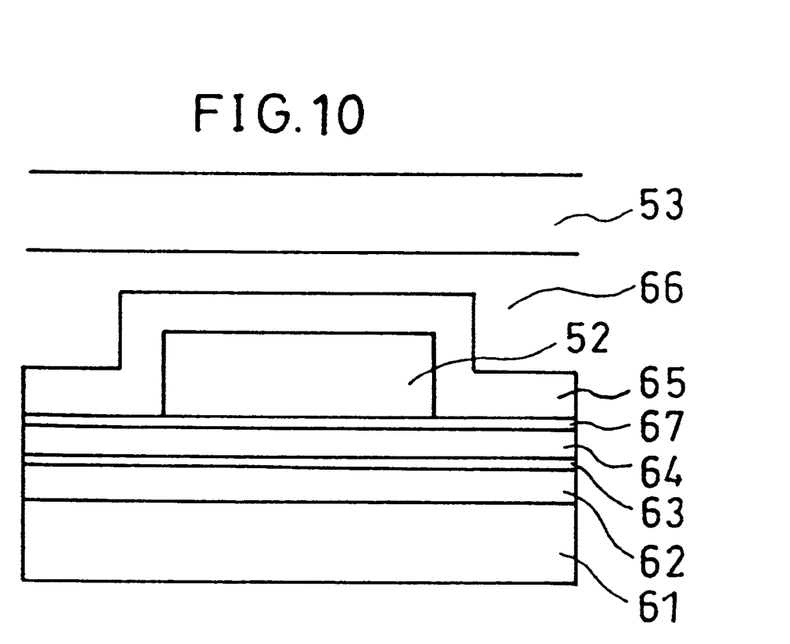
FIG. 10 is an explanatory view showing a schematic structure of another example of a magnetic memory cell of the present invention.

Another example of the magnetic memory cell 51 shown in FIG. 8 is shown in FIG. 10. The structure shown in FIG. 10 differs from the structure shown in FIG. 9 in that the ferromagnetic layer 64 and the closed magnetic circuit layer 65 are connected via the metal layer 67. The thickness of the metal layer 67 is set such that the ferromagnetic layer 64 and the closed magnetic circuit layer 65 are exchange coupled. Therefore, when carrying out the rewriting of information on the magnetic memory cell 51 in the above manner, in other magnetic memory cells than the magnetic cell 51, in which rewriting of information is not performed, the respective magnetizations of the ferromagnetic layer 64 and the closed magnetic circuit layer 65 surely form a closed magnetic circuit by the antiferromagnetic coupling via the metal layer 67.

In the present embodiment, as a magnetic memory cell having a closed magnetic circuit structure, two examples adopting the MTJ device have been shown; however, the present invention is not limited to the above, and the magnetic memory cell having other closed magnetic circuit structure may be adopted. In the present embodiment, the word line is provided on the bit line, however, it may be provided below the MTJ device. Also, it may be arranged so as to insulate the bit line from the MTJ device, or the bit line and the word line are exchanged, or the bit line or the word line are separately provided for recording and reading out. The bit line, word line, and the closed magnetic circuit structure are not limited to the above.

As described, the first magnetic tunnel junction device of the present invention including at least a first magnetic layer, an insulating layer and a second magnetic layer which are laminated in this order, is characterized by further including: a third magnetic layer formed on an opposite side of an insulating layer forming side of the first or second magnetic layer via a metal layer with a spacing formed at a central portion, wherein the first or second magnetic layer and the third magnetic layer form a closed magnetic circuit.

According to the forgoing arrangement, the magnetization of the third magnetic layer serving as the closed magnetic circuit layer and the first or second magnetic layer form a closed loop; and thus the generation of the magnetic poles at both end portions can be avoided. As described, according to the MTJ device of the described structure, effects of the magnetic poles generated at both end portions can be avoided. Thus, a stable magnetization state as recorded can be maintained even for a miniaturized pattern. Additionally, since the memory layer of the ferromagnetic layer has a closed magnetic circuit structure, stable magnetization state as recorded can be ensured against an external leakage magnetic field.

The second magnetic tunnel junction device having the structure of the first magnetic tunnel junction device is characterized in that at least one lead line is formed in the spacing between the third magnetic layer and the first or second magnetic layer.

According to the foregoing structure, by forming the lead line in the spacing at the central portion between the first or second magnetic layer and the third magnetic layer, a current value required for inverting the magnetization direction of the magnetic layer and the closed magnetic circuit layer can be reduced, and the power consumption of the magnetic memory adopting the MTJ device can be reduced.

The third magnetic tunnel junction device of the present invention which includes at least the first magnetic layer, the first insulating layer, the second magnetic layer, the second insulating layer and the third magnetic layer which are laminated is characterized by including:

a fourth magnetic layer formed on a first insulating layer laminating side or a second insulating layer laminating side of the second magnetic layer via a metal layer with a spacing at a central portion, and the second magnetic layer and the fourth magnetic layer form a closed magnetic circuit.

According to the described arrangement, a high resistance change ratio can be obtained, and the effects of the magnetic poles generated at both end portions can be reduced. Thus, a stable magnetization state as recorded can be maintained even for a miniaturized pattern. Additionally, since the memory layer of the ferromagnetic layer has a closed magnetic circuit structure, stable magnetization state as recorded can be ensured against an external leakage magnetic field.

The fourth magnetic tunnel junction device of the present invention having the structure of the third magnetic tunnel junction device is characterized by further including a first antiferromagnetic layer which is exchange-coupled with the first magnetic layer, and a second antiferromagnetic layer which is exchange coupled with the third magnetic layer.

The fifth magnetic tunnel junction device of the present invention having the structure of the fourth magnetic tunnel junction device is characterized in that an exchange coupling between the first antiferromagnetic layer and the first magnetic layer disappears at different temperature from a temperature at which an exchange coupling between the second antiferromagnetic layer and the third magnetic layer disappears.

The sixth magnetic tunnel junction device having the structure of the first or second magnetic tunnel junction device is characterized in that:

at least the first magnetic layer or the second magnetic layer is composed of two or more ferromagnetic layers which are antiferromagnetically coupled via a metal layer.

According to the above arrangement, in order to read out information in the foregoing manner, i.e., based on changes in resistance depending on whether the magnetization direction of the closed loop composed of the first or third magnetic layer and the second magnetic layer (closed magnetic circuit layer), and the magnetization direction of the ferromagnetic layer and the first or third magnetic layer are parallel to or antiparallel to one another, it is required to fix the magnetization direction of the ferromagnetic layer in the same direction as the first or third magnetic layer.

According to the above arrangement, the magnetization direction of the ferromagnetic layer and the first or third magnetic layer can be fixed with a single treatment or a magnetic field of the same direction. As a result, the process can be simplified.

With the foregoing preferred embodiment, the first magnetic layer composed of two ferromagnetic layers, and the third magnetic layer of a single ferromagnetic layer are adopted. However, the present invention is not limited to this arrangement as long as the condition that the respective numbers of magnetic layers differ between the two fixed layers by one.

In the present embodiment, the same antiferromagnetic material may be used for the antiferromagnetic layer 41 and the antiferromagnetic layer 49.

The seventh magnetic tunnel junction device of the present invention having any of the third through sixth magnetic tunnel junction devices, is characterized in that:

at least one lead line is formed in the spacing between the second magnetic layer and the fourth magnetic layer.

According to the described arrangement, by forming the lead line in the spacing between the second magnetic layer and the fourth magnetic layer, a current value required for inverting the magnetization direction of the second magnetic layer and the fourth magnetic layer (closed magnetic circuit layer) can be reduced.

The first magnetic memory of the present invention is characterized by adopting a magnetic tunnel junction device of the present invention which includes at least a first magnetic layer, an insulating layer and a second magnetic layer which are laminated in this order and further includes a third magnetic layer serving as a closed magnetic circuit layer formed on different side of an insulating layer forming side of the first magnetic layer or the second magnetic layer, wherein the third magnetic layer is formed via a metal layer so as to have a spacing at a central portion, and the third magnetic layer forms a closed magnetic circuit with the first magnetic layer or the second magnetic layer.

According to the forgoing arrangement, the magnetization of the third magnetic layer serving as the closed magnetic circuit layer and the first or second magnetic layer form a closed loop; and thus the generation of the magnetic poles at both end portions can be avoided. As described, according to the MTJ device of the described structure, effects of the magnetic poles generated at both end portions can be eliminated. Thus, a stable magnetization state as recorded can be maintained for a miniaturized pattern. Additionally, since the memory layer of the ferromagnetic layer has a closed magnetic circuit structure, a stable magnetization state as recorded can be ensured against an external leakage magnetic field. Therefore, a power consumption of the magnetic memory adopting the MTJ device can be reduced.

The second magnetic memory of the present invention having the structure of the first magnetic memory is characterized by including at least one lead line in the spacing between the first or second magnetic layer and the third magnetic layer.

The third magnetic memory of the present invention is characterized by including a magnetic tunnel junction device which includes at least the first magnetic layer, the first insulating layer, the second magnetic layer, the second insulating layer and the third magnetic layer which are laminated, and further includes a fourth magnetic layer formed on a first insulating layer laminating side or a second insulating layer laminating side of the second magnetic layer via a metal layer with a spacing at a central portion, wherein the second magnetic layer and the fourth magnetic layer forms a closed magnetic circuit.

According to the described arrangement, a high resistance change ratio is obtained, and the effects of the magnetic poles generated at the end portion can be reduced. Thus, a stable magnetization state as recorded can be maintained for a miniaturized pattern. As a result, a magnetic memory of an improved integration can be realized, and a power consumption of the magnetic memory can be reduced.

The access method of the magnetic memory cell of the present invention is characterized by including the steps of:

forming a closed magnetic circuit on a magnetic layer for storing a memory of a magnetic memory cell;

placing a first current line in a closed magnetic circuit composed of the magnetic layer and the closed magnetic circuit layer, and a second current line outside the closed magnetic circuit;

changing the magnetization direction of the magnetic layer by applying such current to the first current line that the magnetization of the closed magnetic circuit layer is inverted but the magnetization of the magnetic layer is not inverted, and applying such current to the second current line that the magnetization of the magnetic layer is not inverted by the second current line alone, but the magnetization of the magnetic layer is inverted by a synthetic magnetic field with the first current line.

According to the described access method of the magnetic memory cell, by controlling the magnetic characteristics of the ferromagnetic layer and the closed magnetic circuit layer and the level of current flowing through the first current line (bit line) and the second current line (word line), access to only one magnetic memory cell is permitted, and a required recording current can be reduced. Further, the effects of magnetic poles at both end portions on the magnetic memory cell can be suppressed. As a result, a stable magnetization state can be ensured even for a miniaturized pattern, and a highly integrated magnetic memory can be realized. Additionally, by adopting the closed magnetic circuit layer structure for the memory layer, a stable magnetization state as recorded can be ensured against an external leakage magnetic field. Further, a power consumption of the magnetic memory can be reduced.

Further, the first current line is formed within the closed magnetic circuit layer structure formed by the magnetic layer (ferromagnetic layer 64) and the closed magnetic circuit layer, the magnetization of the closed magnetic circuit layer can be inverted at sufficiently low current, thereby effectively applying the magnetic layer.

The first magnetic cell of the present invention adopting the above access method is characterized by including a magnetic tunnel junction device which includes a first magnetic layer, an insulating layer, and a second magnetic layer which are laminated in this order, wherein at least the closed magnetic circuit layer is formed on an opposite side of an insulating layer forming side of the first or second magnetic layer with a spacing at a central portion, and the first or second magnetic layer and the closed magnetic circuit layer form a closed magnetic circuit.

The second magnetic cell of the present invention adopting the above access method is characterized by including a magnetic tunnel junction device which includes a first magnetic layer, an insulating layer, and a second magnetic layer which are laminated in this order, wherein at least the closed magnetic circuit layer is formed on an opposite side of an insulating layer forming side of the first or second magnetic layer via a metal layer with a spacing at a central portion, and the first or second magnetic layer and the closed magnetic circuit layer form a closed magnetic circuit.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. A magnetic tunnel junction device comprising at least a first magnetic layer, and insulating layer and a second magnetic layer which are laminated in this order, further comprising:

a third magnetic layer formed on opposite side of the insulating layer forming side of said first or second magnetic layer via a metal layer with a spacing formed at a central portion, wherein said first or second magnetic layer and said third magnetic layer form a closed magnetic circuit.

2. The magnetic tunnel junction device as set forth in claim 1, wherein:

at least one lead line is formed in said spacing between said first or second magnetic layer and said third magnetic layer.

3. The magnetic tunnel junction device as set forth in claim 1, wherein:

a thickness of the metal layer is set to such thickness that the first or second magnetic layer and the third magnetic layer are antiferromagnetically coupled.

4. The magnetic tunnel junction device as set forth in claim 1, wherein:

said metal layer is formed on both end portions.

5. The magnetic tunnel junction device as set forth in claim 1, wherein:

said metal layer is made of a material selected from the group consisting of Ru, Cr, Cu and alloys thereof.

6. A magnetic memory adopting a magnetic tunnel junction device comprising at least a first magnetic layer, and insulating layer and a second magnetic layer which are laminated in this order, and a third magnetic layer formed on an opposite side of the insulating layer forming side of the first or second magnetic layer via a metal layer with a spacing at a central portion, wherein said first or second magnetic layer and said third magnetic layer form a closed magnetic circuit.

7. The magnetic memory as set forth in claim 6, wherein at least a lead line is formed in a spacing between said first or second magnetic layer and said third magnetic layer.

* * * * *